United States Patent [19]

Bernardi

[11] Patent Number: 4,906,325
[45] Date of Patent: Mar. 6, 1990

[54] METHOD OF MAKING SINGLE-CRYSTAL MERCURY CADMIUM TELLURIDE LAYERS

[75] Inventor: Sergio Bernardi, Turin, Italy
[73] Assignee: Selenia Industrie Elettroniche Associate S.p.A., Milan, Italy
[21] Appl. No.: 254,380
[22] Filed: Oct. 5, 1988
[30] Foreign Application Priority Data Oct. 6, 1987 [IT] Italy ............................ 67842 A/87

[51] Int. Cl.$^4$ ........................................... H01L 21/368
[52] U.S. Cl. ................................. 156/621; 156/624; 156/DIG. 72; 437/120
[58] Field of Search ............... 156/624, 621, DIG. 72; 437/120

[56] References Cited

U.S. PATENT DOCUMENTS 4,642,142 2/1987 Harman .................... 156/DIG. 72

*Primary Examiner*—Melvyn J. Andrews
*Attorney, Agent, or Firm*—Herbert Dubno

[57] ABSTRACT

A method of making symmetrical mercury cadmium telluride layers by epitaxial growth on a cadmium telluride substrate, performed inside a reactor with two communicating zones, kept at different and controlled temperatures. Growth solution is directly prepared inside the reactor by submitting to a specific thermal cycle a weighed tellurium quantity, a saturating cadmium telluride substrate and a mercury bath.

6 Claims, 1 Drawing Sheet

METHOD OF MAKING SINGLE-CRYSTAL MERCURY CADMIUM TELLURIDE LAYERS

FIELD OF THE INVENTION

The present invention relates to industrial processes for preparing semiconductor materials for optoelectronic devices and, more particularly to a method of making single-crystal mercury cadmium telluride layers with every possible cadmium/mercury ratio.

BACKGROUND OF THE INVENTION

Nowadays mercury-cadmium telluride is considered highly suitable for the fabrication of optoelectronic devices operating at high wavelengths. More particularly, because of its low energy gap between valence and conduction bands, it is suited to the fabrication of photodetectors for infrared radiation with wavelengths in the 8 and 14 um. In fact, the energy necessary to produce electron-hole pairs in the semiconductor is of only 0.1 eV. Optoelectronic devices can thus be fabricated for detecting low-energy radiations, such as, for instance, those emitted by objects at room temperature.

Mono- or bidimensional arrays, forming the photosensitive elements of high-performance imaging systems can be made from devices of this kind. These systems can supply thermal images useful in various applications, by instance illness diagnosis, terrestrial pollution mapping from on board satellites, sighting of objects or people under poor visibility conditions, etc.

High performance electronic devices are fabricated using a basic semiconductor material available as single crystal. In fact only in this case does the material present physical properties which are constant and well known at each point of its volume; that is why the performances of the devices obtained therefrom may be optimized. Besides, the single crystal obtained must present a lattice periodicity as perfect as possible, in order to avoid undesired reductions in the quantatative efficiency of photodetection.

Such characteristics can be better obtained by epitaxial growth techniques, which also allow the formation of wide surfaces necessary to the fabrication of photodetector arrays. Liquid and vapor phase fabrication techniques are well known. The former are nowadays the most-widely used.

Liquid-phase epitaxial growth consists of the deposition on a single-crystal substrate of alloys with compositions depending on those of suitable growth solutions. Starting from solutions wherein melted tellurium acts as solvent and cadmium and mercury as solutes, single-crystal layers of the ternary mercury cadmium telluride compound are deposited on the binary cadmium telluride compound, generally used as substrate. The deposition takes place by bringing the substrate into contact with the slightly supersaturated solution.

The crystal growth solution has been till now prepared in a cycle different from that in which epitaxial growth takes place. The preparation method consisted of sealing in a quartz ampoule convenient quantities of tellurium, cadmium and mercury, of homogenizing them at a temperature higher than 500° C. for some tens of hours, and of rapidly quenching them to preserve the homogeneous composition of the liquid.

Unluckily, this growing technique, as well as vapor phase technique, is highly complicated by the strong tendency of mercury to evaporate. This disadvantage is favored by the necessity of causing the growth process to evolve at temperatures higher than the melt temperature of solvent tellurium, equal to about 500° C. Mercury evaporation causes composition variations during growth thermal cycles both in the single crystal solid and in the solution it is generated by (in liquid-phase techniques).

To overcome this disadvantage different methods have been suggested to protect the solution composition. A method described in "Semiconductors and Semimetals", Academic Press, Vol. 18, 1981, pages 70–84, suggests the insertion in a sealed ampoule of both the solution and the substrate on which the deposition is effected by bringing into contact the solution and solid. Howver this method has been abandoned owing to the difficulties encountered in controlling growth phases inside the closed ampoule and to the impossibility of implementing structures with different composition layers.

According to another method, described by T. C. Harman in the papers issued in Journal of Electronic Materials, Vol. 9, No. 6, pages 945–961 and Vol. 10, No. 6, pages 1069–1085 the solution and substrate are placed in a reactor with hydrogen atmosphere at atmospheric pressure and the solution composition is preserved by means of a mercury source inside the reactor itself. The source consists of a mercury bath maintained at a lower temperature than that of the growth solution, but such as to produce a partial mercury vapour pressure equal to that of solution equilibrium. That is obtained by placing the reactor in a furnace with two zones at different temperatures.

This method, according to the literature, requires the solution to be prepared in a phase preceding the growth phase. This is a disadvantage due to possible contamination of the solution during handling and certainly the duration of the process is longer.

SUMMARY OF THE INVENTION

The disadvantages described above are overcome by the method of fabricating single-crystal mercury cadmium telluride layers of by the present invention, which permits implementing in a single phase both the preparation of the growth solution and the epitaxial growth, thus completely avoiding the operations of preparing the ampoule, which are long and detrimental to material purity.

The method of the invention allows fabricating in different phases solids with ternary compositions which may be chosen with continuity between those of extreme binary compounds CdTe and HgTe, without changing the quantities of elements and compounds introduced into the crucible at the process beginning. As an alternative, different-composition layers can be obtained on the same substrate and from the same growth solution, by subdividing the thermal cycle into different phases which can be controlled from the outside.

The present invention provides a method of fabricating single-crystal mercury cadmium telluride layers by epitaxial growth on a cadmium telluride substrate, performed inside a reactor with two communicating zones maintained at different and controlled temperatures, characterized in that:

a weighted amount of tellurium is placed in the well of a crucible placed inside the reactor in the higher-temperature zone and is melted, and well being supplied with a semicover of cadmium telluride;

a mercury bath is placed inside the reactor in the lower-temperature zone an is heated so as to obtain a mercury vapor atmosphere in the whole reactor;

due to the absorption of vapor state mercury, the melted tellurium is converted into a solution of mercury in tellurium and homogenized as an effect of thermal agitation at the higher tempeature;

by rotation of the said crucible the solution of mercury in tellurium is brought into contact with the semicover for a time sufficient to saturate the solution at the higher temperature;

by a rotation opposite to the preceding one the saturated mercury cadmium in tellurium solution is separated from the semicover;

solution and mercury bath are slowly cooled down so as to produce the solution supersaturation and keep its composition constant; and the growth substrate is brought into contact with the solution and the epitaxial growth of single-crystal mercury cadmium telluride is carried out.

BRIEF DESCRIPTION OF THE DRAWING

The above and other objects, features and advantages of the present invention will become more readily apparent from the following description, reference being made to the accompanying drawing in which.

SPECIFIC DESCRIPTION

Figure 1:
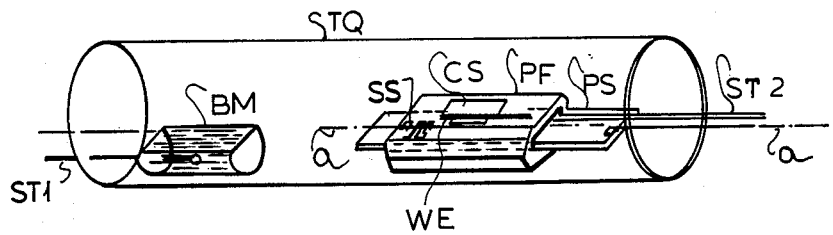
FIG. 1 is a schematic representation of a reactor for epitaxial growths.

The reactor, schematically represented in FIG. 1, consists of a quartz tube TQ, wherein a hydrogen flow is maintained under atmospheric pressure, in order to avoid oxidative phenomena. On the left there is a mercury bath BM, maintained at temperature THg, and on the right the growth crucible. The latter comprises a slider PS, housing a cadmium telluride substrate SS, and a fixed part PF containing a well WE for growth solution, kept at temperature Tsol. A cadmium telluride substrate CS is placed on the well so as to act as a partial cover.

ST1 and ST2 denote two temperature probes, permitting an accurate measurement of the temperatures of the mercury bath and of the growth solution, contained in the well WE. Moreover, a two-zone furnace, not represented in the drawing, surrounds the quartz tube so as to maintain mercury bath and solution at above temperatures THg and Tsol.

After attaining optimal growth conditions, the solution composed of tellurium, cadmium and mercury in the desired pourcentages is brought into contact with the substrate moving crucible slider PS and is kept in this position for the time necessary to deposit the desired thickness of mercury cadmium telluride.

The invention deals with the process part which preceds the epitaxial growth and particularly concerns the way of generating the desired growth solution starting from a weighted tellurium quantity, from the well cover in cadmium telluride and from the mercury bath, following a particular thermal cycle under suitable conditions.

The growth solution is wholly generated inside the growth crucible (in situ), by proportioning from the outside mercury and cadmium contents through the control of the temperatures of mercury bath and growth crucible containing tellurium. As previously mentioned these temperatures are reached by a two-zone furnace surrounding quartz tube TQ. The mercury bath temperature determines the mercury contents in growth solution, while the temperatures near the growth crucible determines the cadmium contents.

After the desired tellurium quantity has been introduced into the growth crucible well, substrate SS is placed on the slider PS.

The growth crucible without the mercury bath is introduced into the quartz tube raised to operative thermal conditions by the two-zone furnace. The crucible temperature reaches about 500° C., hence tellurium melts and after an interval of about half an hour its temperature is stabilized.

Now, the mercury bath is introduced into the quartz tube and its temperature is progressively raised to value THg of the left part of the furnace. As a consequence a mercury vapor atmosphere is created with a pressure determined by the temperature, which is generally of about 230° C. Hence the long absorption phase of the mercury by melted tellurium can start, obtaining progressively a mercury in tellurium solution. At the same time with the formation phase, there is also a homogenization phase of the solution.

Partial mercury pressure of the solution is exactly equal to mercury bath pressure at temperature THg. Hence, by controlling temperature THg by the two-zone furnace, mercury concentration in growth solution is controlled.

The solution is enriched with cadmium by bringing it into contact with cadmium telluride substrate CS, placed as a partial cover of the well containing the solution itself, exploiting the different chemical potentials of mercury and cadmium bonds with tellurium. The contact is achieved by rotating by about 90° around axis a-a of the growth crucible, (FIG. 1) comprising the well with mercury in tellurium solution. The rotation makes the saturating substrate CS become a side of the well, avoiding the solution spilling and at the same time causing the contact. At this point a dissolution phase of saturating substrate CS begins with cadmium (and tellurium) enriching, till the growth solution reaches an equilibrium composition, where the contents of single elements are only determined by temperatures.

After a time interval of about one hour and half, necessary to achieve the equilibrium between solid and liquid phases, which equilibrium is also affected by mercury vapor phase, the crucible is put again in horizontal position so as to separate the saturating substrate from growth solution.

At this point, mercury and cadmium concentration determine the composition of solid single-crystal layers to deposit on the substrate.

By moving slider PS, the substrate is then brought into contact with the solution slightly supersaturated by a suitable temperature reduction and is left in this position for some tens of minutes, so as to obtain the desired thickness of deposited solid.

The separation between solid and liquid phases obtained by putting again the crucible in horizontal position was rendered necessary in order to prevent the solution from reaching a new equilibrium under the new conditions. This would prevent the solution from attaining the supersaturation condition necessary to obtain epitaxial layer deposition.

Figure 2:
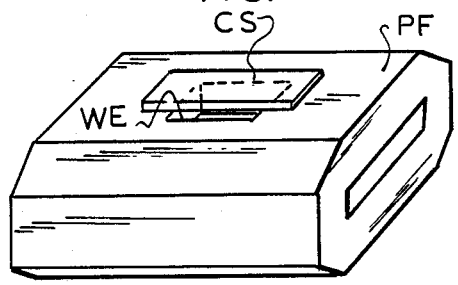
FIG. 2 is an enlarged schematic representation of the crucible shown in FIG. 1.

FIG. 2 shows an enlarged part of the growth crucible with the well containing solution and saturating substrate; references are the same as in FIG. 1.

Figure 3:
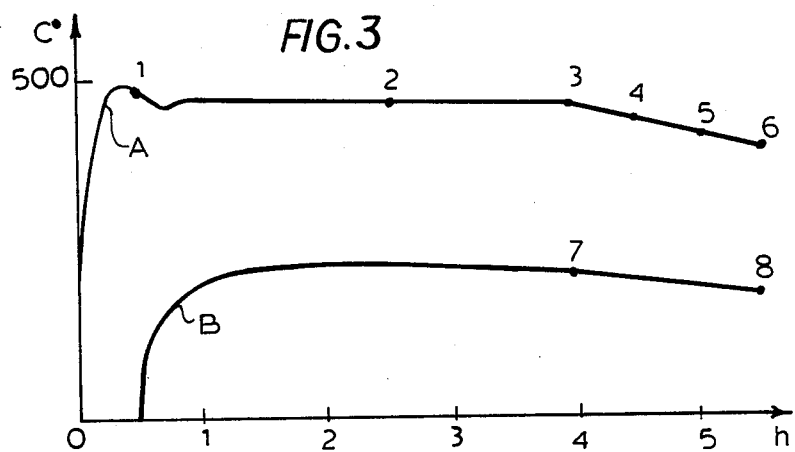
FIG. 3 is a time diagram representing temperature profiles of the baths contained in the reactor.

The temperature profiles in the solution and in the mercury bath versus time are plotted on the cartesian diagram of FIG. 3 and are respectively denoted by A and B.

The part of curve A which goes from origin to point 1, of the duration of about half an hour, corresponds to melting period of tellurium. Among points 1 and 2, for the duration of about two hours, there is saturation of tellurium by mercury, hence, at point 2, the crucible is rotated and the phase of saturation by cadmium starts. The phase lasts about one hour and a half till point 3 is reached. Here the solution is separated from saturating substrate and the temperature is lowered by 2 or 3 degrees for half an hour till point 4 is reached, where the solution can be found in a supersaturated condition. Then the epitaxial growth can start, which really begins at point 5 and ends at point 6.

Curve B, relevant to mercury bath temperature, starts from room temperature half an hour after tellurium heating has started and reaches the temperature necessary to generate the desired partial pressure of mercury vapor. The solution is formed in correspondance with point 7 and only its composition must be preserved during epitaxial growth on the substrate. To this aim also the mercury bath is submitted to controlled cooling of some tenths of a degree per minute, comprised between points 7 and 8. Yet, to avoid variations in the solution composition the ratio among time derivatives of the temperatures must be equal to the ratio among the temperature derivatives of corresponding vapour pressures.

Operative conditions and the results reached during a typical growth process of single-crystal mercury cadmium telluride layers are now described.

SPECIFIC EXAMPLE

If the mercury bath is kept at a constant temperature of about 230° C. and growth solution at a temperature of 485° C., a composition is obtained with percentages equal to 0.55 and 0.45 in mercury and cadmium, respectively. By reducing to the solution temperature to 470° C., the solution composition, and hence the composition of crystal layers deposited, presents percentages equal to 0.80 and 0.20 in mercury and cadmium, respectively.

At a 2 or 3-degree lower temperature, supersaturation conditions allowing growth to start are obtained. Mercury bath temperature during growth phase decreases by 0.2° C./min, with a ratio among gradients equal to about 1.2.

Thus single-crystal layers of a thickness ranging from 20 to 40 μm and a good morphology are obtained on a 3 cm² substrate, using 0.08-mole solution.

In case different-composition single-crystal layers are desired, after the deposition of first layer, substrate SS is brought again in waiting conditions and, by a convenient variation in thermal conditions, solution and saturating substrate CS are brought again into contact. After reaching the new equilibrium conditions the contact is interrupted by an opposite rotation of the crucible, the growth solution is again supersaturated and, after bringing again the substrate SS into contact with the solution, different-composition layers are deposited. The cycle can be repeated even many times to obtain a plurality of layers, without necessity of handling the compounds contained in the quartz tube, but acting only on temperatures and positions of reactor elements, all controllable from the outside. Thus high-purity cadmium mercury telluride single crystals can be obtained.

It is clear that what has been described has been given only by way of nonlimiting example. Variations and modifications are possible without going out of the scope of the invention.

I claim:

1. A method of fabricating single-crystal mercury cadmium telluride layers by epitaxial growth on a cadmium telluride substrate, performed inside a reactor (TQ) with two communicating zones maintained at different and controlled temperatures, said method comprising the steps of:

placing a weighed amount of tellurium in a well of a crucible placed inside the reactor (TQ) in a higher-temperature zone and melting the tellurium, the well being supplied with a semicover (CS) of cadmium telluride;

placing a mercury bath (BM) inside the reactor in a lower-temperature zone and heating the mercury bath so as to obtain a mercury vapor atmosphere in the whole reactor;

converting the molten tellurium by the absorption of vapor state mercury thereby, into a solution of mercury in tellurium and homogenizing the solution as an effect of thermal agitation at the higher temperature;

rotating said crucible to bring the solution of mercury in tellurium into contact with the semicover (CS) for a time sufficient to saturate the solution at the higher temperature;

rotating the crucible opposite to the preceding rotation to separate the saturated mercury and cadmium in tellurium solution from the semicover;

slowly cooling the solution of mercury and cadmium in tellurium and the mercury bath so as to produce a solution supersaturation and keep the composition of the solution of mercury and cadmium in tellurium constant; and bringing a growth substrate (SS) into contact with the solution in supersaturation and carrying out an epitaxial growth of single-crystal mercury cadmium telluride on said substrate.

2. A method as in claim 1, wherein a desired composition of said solution of mercury and cadmium in tellurium is obtained by adjusting the lower temperature of the mercury bath (BM) and the higher temperature to which the solution is raised during its contact with the semicover (CS).

3. A method as in claim 2 wherein the composition of said solution of mercury and cadmium in tellurium is maintained constant during the entire epitaxial growth by contemporarily reducing the solution and mercury bath temperatures, but maintaining the ratio between time derivatives of said temperatures equal to the ratio between temperature derivatives of respective partial pressures.

4. A method of forming an epitaxial layer of mercury-cadmium telluride upon a cadmium telluride substrate, comprising the steps of:

(a) introducing a measured amount of tellurium into a well of a crucible having a slider closing a bottom of the well and a cadmium telluride cover partially closing a top of the well;

(b) heating said crucible in a reactor to a relatively higher temperature sufficient to melt the tellurium in said well;

(c) heating a mercury bath in said reactor and in communication with the crucible to a relatively lower temperature sufficient to generate a mercury vapor atmosphere in said reactor;

(d) controlling said temperature so as to cause molten tellurium in said well to absorb mercury vapor from said atmosphere and form a homogeneous solution of mercury in tellurium at said higher temperature;

(e) thereafter rotating said crucible to bring said solution into contact with said cover and maintaining contact between the cover and said solution until said solution is saturated with cadmium at said higher temperature, thereby forming a mercury-cadmium-tellurium solution;

(f) then rotating said crucible to remove said solution from contact with said cover and position said mercury-cadmium-tellurium solution above said slider;

(g) slowly cooling said crucible to supersaturate the mercury-cadmium-tellurium solution in said well while maintaining the composition of the mercury-cadmium-tellurium solution constant;

(h) shifting said slider to contact said substrate with said mercury-cadmium-tellurium solution; and (i) maintaining said contact between said substrate and said mercury-cadmium-tellurium solution to effect epitaxial growth of a mercury-cadmium telluride layer on said substrate.

5. The method defined in claim 4, further comprising the steps of controlling the mercury content of said mercury-cadmium-tellurium solution in said well by regulating said lower temperature, and controlling the cadmium content of said mercury-cadmium-tellurium solution in said well by regulating said higher temperature while said solution is in contact with said cover in step (e).

6. The method defined in claim 5 wherein the composition of said mercury-cadmium-tellurium solution in said well is maintained constant during the epitaxial growth in step (i) by contemporaneously reducing the temperatures of said mercury-cadmium-tellurium solution and of said mercury bath, while maintaining a ratio between time derivatives of said temperatures of said mercury-cadmium-tellurium solution and of said mercury bath equal to the ratio between temperature derivatives of respective partial pressures.

* * * * *